(12) United States Patent
Goh (10) Patent No.: US 6,698,486 B2
(45) Date of Patent: Mar. 2, 2004

(54) APPARATUS FOR REMOVING WAFER RING TAPE

(75) Inventor: Seok Goh, Chungcheongnam-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 233 days.

(21) Appl. No.: 10/008,703

(22) Filed: Dec. 6, 2001

(65) Prior Publication Data

US 2002/0070302 A1 Jun. 13, 2002

(30) Foreign Application Priority Data

Dec. 7, 2000 (KR) ........................................ 2000-74290

(51) Int. Cl.⁷ .............................................. B32B 35/00
(52) U.S. Cl. ........................ 156/444; 156/247; 156/227; 156/344; 156/584; 156/443; 29/426.3; 29/426.5
(58) Field of Search .................................. 156/217, 227, 156/344, 443, 444, 584, 247; 29/426.2, 426.3, 426.4, 426.5, 426.6, 239, 762

(56) References Cited

U.S. PATENT DOCUMENTS 3,547,744 A * 12/1970 Buchaklian, Jr. ........... 156/584
5,300,170 A * 4/1994 Donohoe .................... 156/235
5,389,169 A * 2/1995 McRae ......................... 156/98
5,705,016 A * 1/1998 Senoo et al. ................ 156/289
5,976,307 A * 11/1999 Cook, Jr. .................... 156/344

FOREIGN PATENT DOCUMENTS

JP  11-111648  * 4/1999

* cited by examiner

Primary Examiner—Mark A. Osele
(74) Attorney, Agent, or Firm—Marger Johnson & McCollom, P.C.

(57) ABSTRACT

An apparatus for removing a wafer ring tape, on which defective chips remain, from a wafer ring after normal chips are detached from the wafer ring tape, is provided. The apparatus comprises a ring table for supporting a tape-adhered wafer ring in which the wafer ring tape is attached to the wafer ring; a detaching head positionable above the ring table and movable for detaching the wafer ring tape from the wafer ring; a blocking pin disposed under the ring table to support the wafer ring tape detached from the wafer ring; and a pair of compressing plates disposed under the ring table to compress the wafer ring tape supported by the blocking pin.

19 Claims, 6 Drawing Sheets

APPARATUS FOR REMOVING WAFER RING TAPE

BACKGROUND OF THE INVENTION

1. Field of the Invention

The present invention generally relates to an apparatus that removes an adhesive tape from a wafer ring.

2. Description of the Related Art

After a well-known wafer fabrication process is performed a semiconductor wafer is cut and separated (wafer sawing or wafer dicing) into individual semiconductor chips by a wafer sawing apparatus. The individual chips are then provided to a semiconductor packaging or assembly process that begin with a chip attaching process. Before the wafer sawing process, the wafer is typically attached to an adhesive tape.

Figure 1:
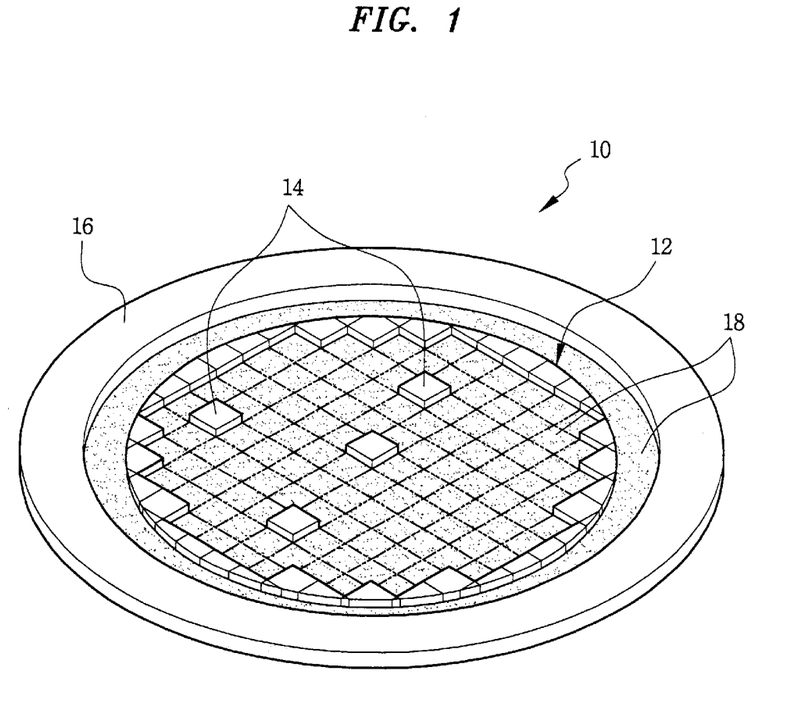
FIG. 1 is a perspective view showing a wafer ring assembly before removing a wafer ring tape.

As shown in FIG. 1, an adhesive tape 18 ("wafer ring tape") is attached to the back surface of the wafer 12. The wafer ring tape 18 is also attached to a wafer ring 16 surrounding the wafer 12. The wafer ring 16 facilitates the handling of the wafer 12. The chips 14 can remain on the wafer ring tape 18 after the wafer sawing process. Each of the chips 14 is detached from the wafer ring tape 18 and then attached to a lead frame or another circuitry substrate. After all normal chips (good dies) are detached, defective chips 14 remaining on the wafer ring tape 18 are discarded together with the wafer ring tape 18. The wafer ring 16 is reused.

A conventional removal of the wafer ring tape and the defective chips is manually performed. However, this causes not only low productivity but also a strong possibility of accidents. In addition, the wafer ring may be damaged or deformed due to careless handling. There is also a possibility that the defective chips are not scrapped but flows out.

SUMMARY OF THE INVENTION

Accordingly, the present invention provides an apparatus for automatically removing a wafer ring tape, on which defective chips remain, from a wafer ring after normal chips are detached from the tape for the following chip attaching step in a semiconductor package assembly process.

The present invention can prevent an outflow of chips by crushing the chips simultaneously with removal of the wafer ring tape.

In a first aspect of the present invention, an apparatus for removing a wafer ring tape from a wafer ring includes a ring table, which supports a tape-adhered wafer ring in which the wafer ring tape is attached to the wafer ring. The apparatus further includes a detaching head that is positionable above the ring table and movable to detach the wafer ring tape from the wafer ring. The apparatus still further includes a blocking pin that is disposed under the ring table to support the wafer ring tape detached from the wafer ring. In addition, the apparatus includes a pair of compressing plates that are disposed under the ring table to compress the wafer ring tape supported by the blocking pin.

Preferably, the apparatus may further include a loading member that is disposed near the ring table to load the tape-adhered wafer ring onto the ring table. The apparatus may further include an unloading member that is disposed near the ring table to unload the wafer ring from the ring table. The apparatus may also include a scrap box that is disposed under the compressing plates to receive the pressed and crushed wafer ring tape. The apparatus may further include a ring box that is disposed near the ring table to receive the wafer ring from which the wafer ring tape is removed.

In another aspect of the present invention, the apparatus for removing a wafer ring tape, on which defective chips remain, from a wafer ring, includes a ring table for supporting a wafer ring assembly in which the wafer ring tape is attached to the wafer ring. The apparatus further includes a detaching head capable of moving vertically, which is disposed above the ring table. The apparatus still further includes a pressing shaft capable of moving vertically separately from the detaching head, which is disposed inside the detaching head. The apparatus further also includes a pair of compressing plates capable of moving horizontally, which are disposed under the ring table. The apparatus further includes a blocking pin capable of moving horizontally, which is disposed in either or both of the compressing plates. In the apparatus, the detaching head moves downwardly and then detaches the wafer ring tape from the wafer ring. In addition, the pressing shaft moves downwardly and then pushes downwardly the detached wafer ring tape so that the wafer ring tape may be folded and temporarily suspended on the blocking pin. Furthermore, the compressing plates press together the folded wafer ring tape and then crush any defective chips that remain on the wafer ring tape.

The apparatus may further include a loading member disposed near the ring table and capable of loading the wafer ring assembly onto the ring table. The apparatus may further include an unloading member disposed near the ring table and capable of unloading the wafer ring from the ring table. The apparatus may also include a scrap box disposed under the compressing plates and capable of receiving the wafer ring tape that has been pressed and crushed by the compressing plates. Also, the apparatus may include a ring box disposed near the ring table and capable of receiving the wafer ring from which the wafer ring tape is removed. In the apparatus, the detaching head may have a cylindrical outer frame forming an inner space, and the cylindrical outer frame may have an outside diameter substantially equal to but less than an inside diameter of the wafer ring.

In still another aspect of the present invention, the apparatus includes a wafer cassette containing a plurality of wafer ring assemblies, each having the wafer ring and the wafer ring tape attached thereto. The apparatus further includes a loading conveyor for supplying the wafer cassette, and a rotatable plate disposed near the loading conveyor to receive the wafer cassette thereon from the loading conveyor and being capable of moving vertically and rotatively. The apparatus also includes a slide disposed close to the rotatable plate to facilitate discharge of the wafer ring assembly from the wafer cassette while the wafer cassette inclines toward the slide by rotation of the rotatable plate; a ring stand disposed near the slide to receive the wafer ring assembly thereon through the slide from the wafer cassette, and a loading picker positionable above the ring stand to move vertically and horizontally to transfer the wafer ring assembly on the ring stand to a new position.

In addition, the apparatus includes a ring table disposed near the loading picker to receive and support the wafer ring assembly transferred by the loading picker, a detaching head disposed above the ring table to move downwardly to detach the wafer ring tape from the wafer ring in the wafer ring assembly; a pressing shaft disposed inside the detaching head to move downwardly separately from the detaching head to fold the detached wafer ring tape, a blocking pin disposed under the ring table to temporarily support the folded wafer ring tape, and a pair of compressing plates disposed under the ring table to press together the wafer ring tape suspended on the blocking pin and crush the defective chips staying on the wafer ring tape.

The apparatus may further include an unloading conveyor disposed near the rotatable plate to unload the wafer cassette, in which a discharge of the wafer ring assembly is finished, from the rotatable plate. The apparatus may also include an unloading picker disposed near the ring table to unload the wafer ring from the ring table. In the apparatus, the ring table may move between the loading picker and the detaching head. In addition, the apparatus may include a scrap box disposed under the compressing plates to receive the wafer ring tape having been pressed and crushed by the compressing plates. The apparatus may additionally include a ring box disposed near the ring table to receive the wafer ring from which the wafer ring tape is removed. In the apparatus, the detaching head may have a cylindrical outer frame forming an inner cylindrical space, and the cylindrical outer frame may have an outside diameter substantially equal to but less than an inside diameter of the wafer ring.

DETAILED DESCRIPTION OF THE INVENTION

The present invention will now be described more fully hereinafter with reference to accompanying drawings, as compared with the prior art. This invention may, however, be embodied in many different forms and should not be construed as limited to the embodiments set forth herein. In the drawings, like numbers refer to like elements throughout.

Some terms used herein are defined as follows. An adhesive tape 18, as shown in FIG. 1, to which a wafer ring 16 is attached and on which defective chips 14 remain after normal chips (good dies) are detached, is referred to as "a wafer ring tape". Therefore, removal of the wafer ring tape 18 can be construed herein to include removal of the defective chips 14.

Additionally, the combination of the wafer ring 16 and the wafer ring tape 18, not the wafer ring 16 alone, is referred to herein as a "tape-adhered wafer ring" or a "wafer ring assembly", which is designated by reference numeral 10 in FIGS. 1, 2, 4 and 5.

Figure 2:
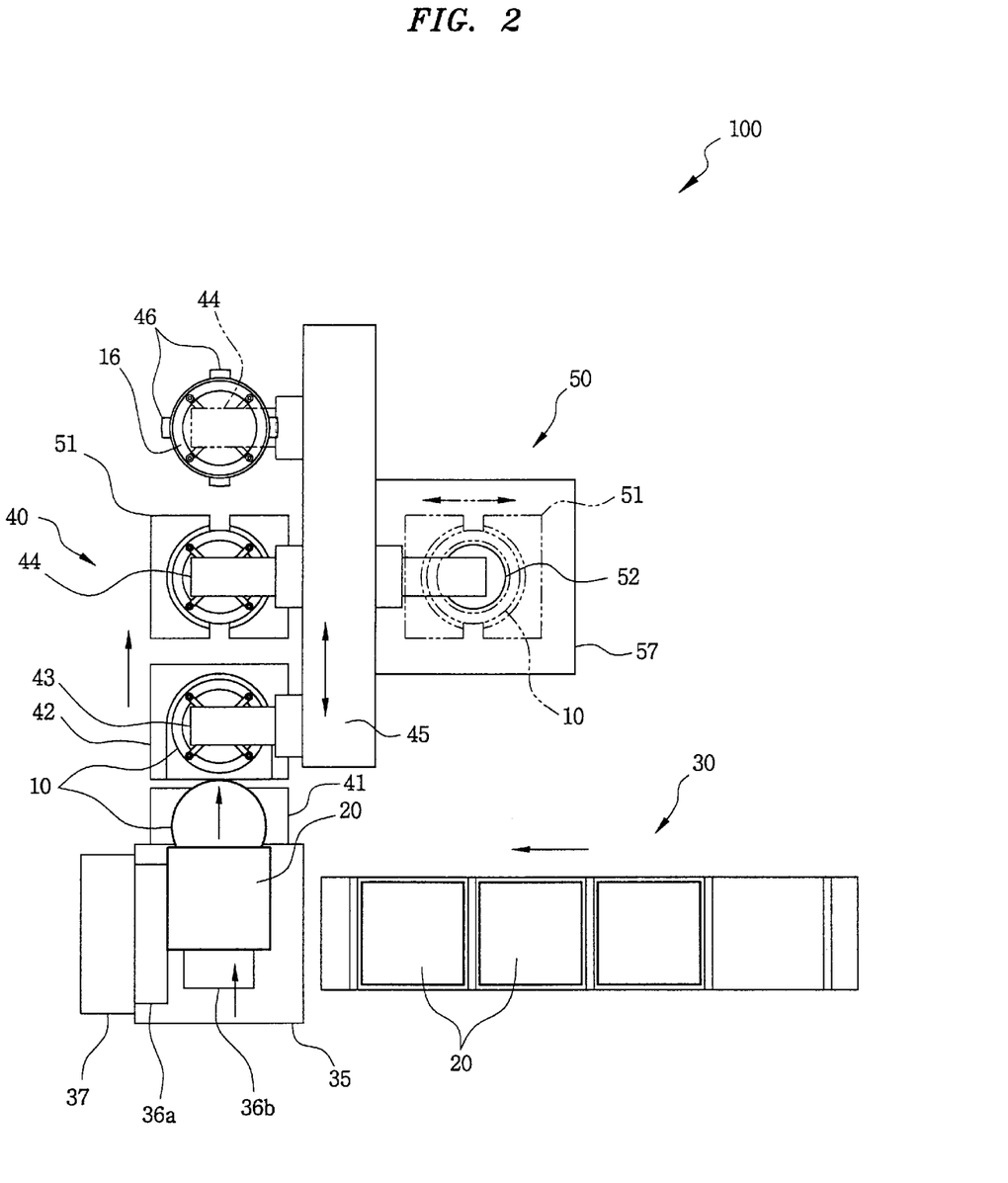
FIG. 2 is a schematic plan view showing an apparatus for removing a wafer ring tape according to one embodiment of the present invention.

FIG. 2 is a schematic plan view showing an apparatus 100 for removing a wafer ring tape according to one embodiment of the present invention. As shown in FIG. 2, the apparatus 100 has a wafer cassette loading/unloading section 30, a wafer ring loading/unloading section 40, and a wafer ring tape removing section 50. The sections 30, 40 and 50 are shown more clearly in FIGS. 3, 4 and 5, respectively.

Figure 3:
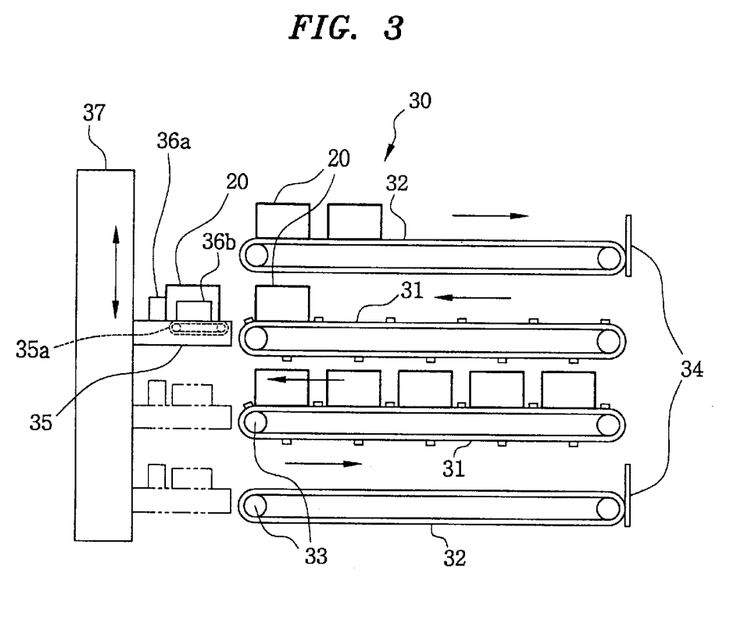
FIG. 3 is a schematic side elevation view showing a wafer cassette loading/unloading section of the removing apparatus of FIG. 2.

A plurality of the wafer ring assemblies 10 are contained in a wafer cassette 20 and supplied to the apparatus 100 through the wafer cassette loading/unloading section 30. Each wafer ring assembly 10 in the wafer cassette 20 is then supplied to the wafer ring tape removing section 50 through the wafer ring loading/unloading section 40. Then, in the removing section 50, the wafer ring tape 18 (FIG. 1) of the wafer ring assembly 10 is removed from the wafer ring 16 (FIG. 1), and the defective chips 14 remaining on the wafer ring tape 18 are crushed. As shown in FIGS. 2 and 3, the wafer cassette loading/unloading section 30 has loading conveyors 31, unloading conveyors 32, rollers 33, stoppers 34, a rotatable plate 35, a fixed supporter 36a, a movable supporter 36b, and a distributor 37.

The loading conveyors 31 are driven by the rollers 33, and supply the wafer cassette 20 to the rotatable plate 35 disposed near the end of the loading conveyor 31. The rotatable plate 35 includes an internal conveyor 35a (FIG. 3) therein for more efficient loading or unloading of the wafer cassette 20. If necessary, two or more loading conveyors may be used, and further, each loading conveyor may carry multiple wafer cassettes. The wafer cassette 20 reaching the rotatable plate 35 is stopped by the fixed supporter 36a. Then the movable supporter 36b pushes the wafer cassette 20 toward a slide 41(FIG. 4A).

The rotatable plate 35 inclines the wafer cassette 20 and then supplies, one by one, the wafer ring assemblies 10 contained in the wafer cassette 20 to the adjacent wafer ring loading/unloading section. After all the wafer ring assemblies 10 are discharged from the wafer cassette 20, the empty wafer cassette 20 is transferred to the unloading conveyor 32. The distributor 37 vertically moves rotatable plate 35, and the internal conveyor 35a drives the wafer cassette 20 toward the unloading conveyor 32.

The unloading conveyor 32 has the stopper 34 at an outer end thereof, and the stopper 34 is equipped with a sensor (not shown). The sensor gives an alarm or stops the unloading conveyor 32 from running when the unloading conveyor 32 is fall of the empty wafer cassettes 20. The unloading conveyor 32 may be a passive type. In case of the passive type conveyor, the wafer cassette 20 is pushed by the wafer cassette moving on the internal conveyor 35a of the rotatable plate 35 and then arrives at the stopper 34. The loading conveyor 31 has also a sensor (not shown) for a worker's safety. The sensor of the loading conveyor 31 stops the loading conveyor 31 when the wafer cassettes 20 are initially loaded on the loading conveyor 31.

Figure 4A:
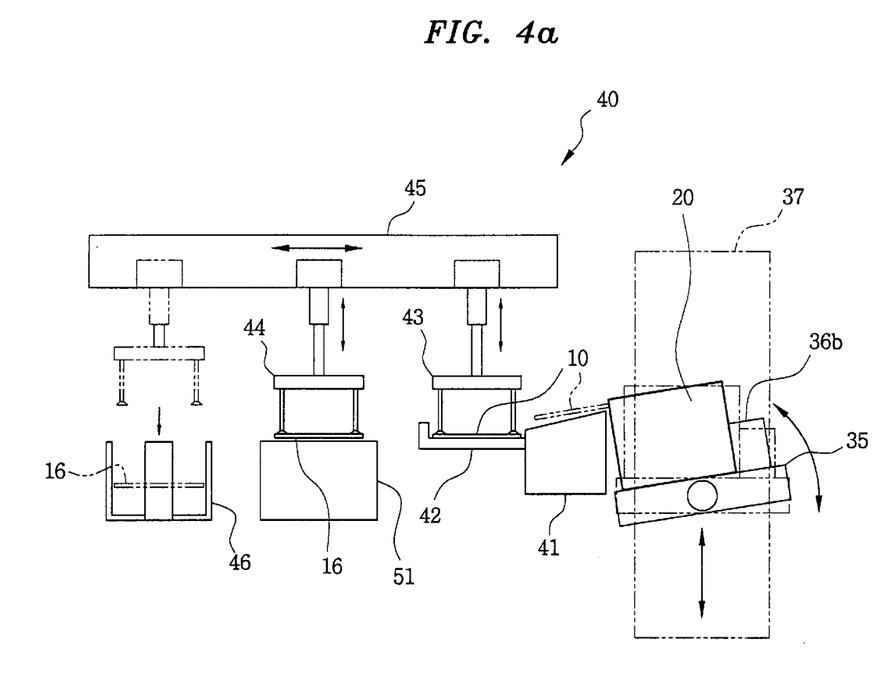
FIGS. 4A and 4B are schematic side elevation views showing a wafer ring loading/unloading section of the removing apparatus of FIG. 2.
Figure 4B:
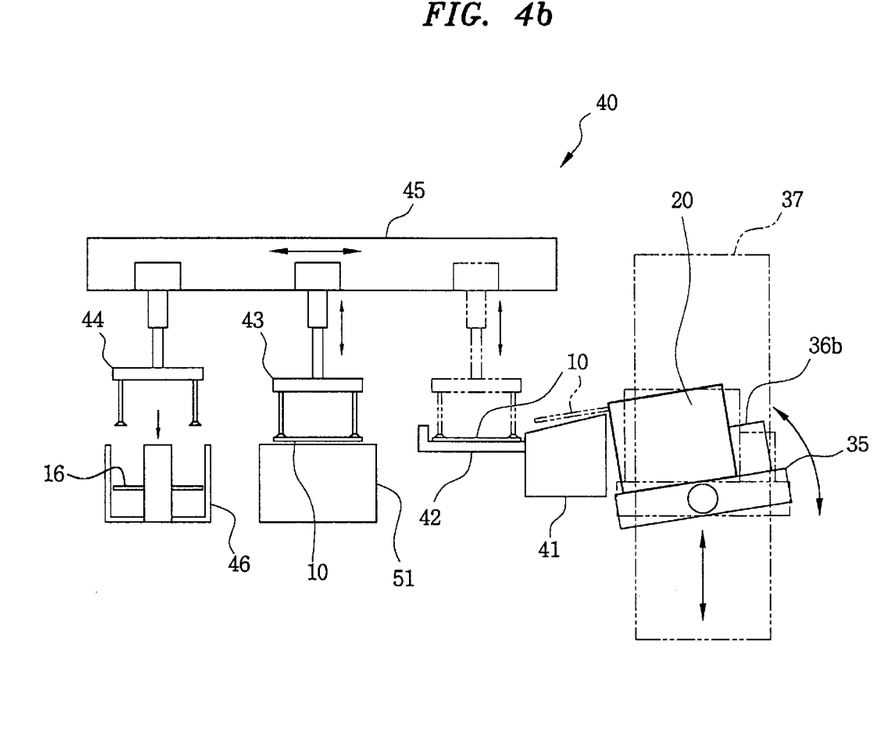

As shown in FIGS. 2 and 4, the wafer ring loading/unloading section 40 has a slide 41, a ring stand 42, a loading picker 43, an unloading picker 44, a transfer arm 45, and a ring box 46.

The wafer ring assemblies 10 stacked in the wafer cassette 20 are sequentially supplied to the ring stand 42 along the slide 41. The slide 41 is disposed close to the rotatable plate 35. When the wafer cassette 20 placed on the rotatable plate 35 is inclined toward the slide 41 by a turning operation of the rotatable plate 35, the uppermost wafer ring assembly 10 in the wafer cassette 20 is discharged along the slide 41. On the other hand, the underlying wafer ring assemblies are obstructed by a confronting sidewall of the slide 41. Then the underlying wafer ring assemblies are discharged one by one according to a gradual rise of the rotatable plate 35.

The loading picker 43 picks up the wafer ring assembly 10 mounted on the ring stand 42 and then supplies it onto a ring table 51 of the wafer ring tape removing section 50. The unloading picker 44 picks up the wafer ring 16 on the ring table 51 and then drops it into the ring box 46. The loading picker 43 and the unloading picker 44 are movably connected to the transfer arm 45. Each picker 43, 44 can move horizontally along the transfer arm 45 and move independently in the vertical direction. A vacuum picker is preferably used as the picker 43, 44, but a gripper can be alternatively used.

The loading and unloading operations can be concurrently carried out. As shown in FIG. 4A, when the loading picker 43 moves down to pick up the wafer ring assembly 10 on the ring stand 42, the unloading picker 44 also moves down to pick up the wafer ring 16 on the ring table 51. After picking up, the pickers 43, 44 move up and run transversely along the transfer arm 45. Thereafter, as shown in FIG. 4B, the loading picker 43 moves down again to lay the wafer ring assembly 10 on the ring table 51. Similarly, the unloading picker 44 moves down to drop the wafer ring 16 into the ring box 46.

As shown in FIGS. 2 and 5a through 5e, the wafer ring tape removing section 50 has the ring table 51, a detaching head 52, a driving cylinder 53, a pressing shaft 54, a blocking pin 55, a pair of compressing plates 56, and a scrap box 57.

The ring table 51 moves reciprocally between the above-described wafer ring loading/unloading section 40 and the wafer ring tape removing section 50. The ring table 51 is located under the loading picker 43 to receive the wafer ring assembly 10 as described above. Then the ring table 51 moves to the wafer ring tape removing section 50 to discard the wafer ring tape 18. After that, the ring table 51 returns to the wafer ring loading/unloading section 40 to discharge the wafer ring 16. FIGS. 5a to 5e show where the ring table 51 is situated in the wafer ring tape removing section 50.

Figure 5A:
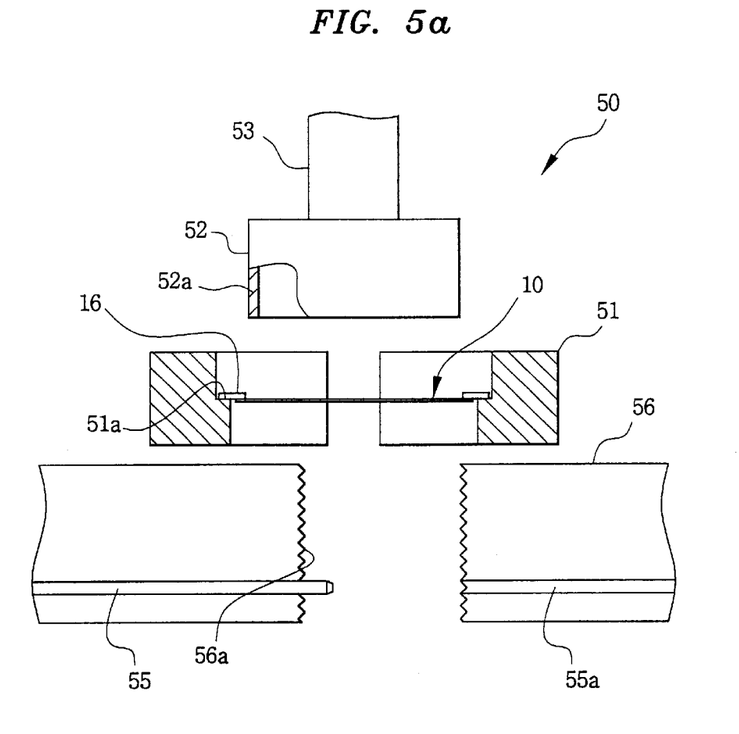
FIGS. 5A to 5E are schematic side elevation views showing wafer ring tape removing section of the removing apparatus of FIG. 2.

As shown in FIGS. 2 and 5A, the ring table 51 has an inside cylindrical space having a projection 51a that extends inwardly toward center of the space. The wafer ring assembly 10 is inserted into the inside space of the ring table 51 and then placed on the projection part 51a. The detaching head 52 is disposed above the ring table 51 and connected to the driving cylinder 53. The driving cylinder 53 drives the detaching head 52. The detaching head 52 has a cylindrical outer frame 52a that forms an inner space. An outside diameter of the cylindrical outer frame 52a is substantially equal to, i.e., slightly less than an inside diameter of the wafer ring 16. In addition, the pressing shaft 54 as shown in FIGS. 5b to 5e is disposed inside the detaching head 52, and moves up and down independently from the detaching head 52 by a separate driving mechanism (not shown).

Under the ring table 51, the blocking pin 55 and the pair of compressing plates 56 are disposed. The scrap box 57 as shown in FIG. 5E is disposed thereunder. One of the pair of compressing plates 56 can be fixed, whereas the other can move in a horizontal direction. The blocking pin 55 is disposed horizontally and may move horizontally within the fixed one of the pair of compressing plates 56. The movable one of the pair of compressing plates 56 has a through hole 55a to receive the corresponding blocking pin 55. Preferably, two blocking pins 55 are used together, which are laterally spaced apart from and parallel to each other.

Figure 5B:
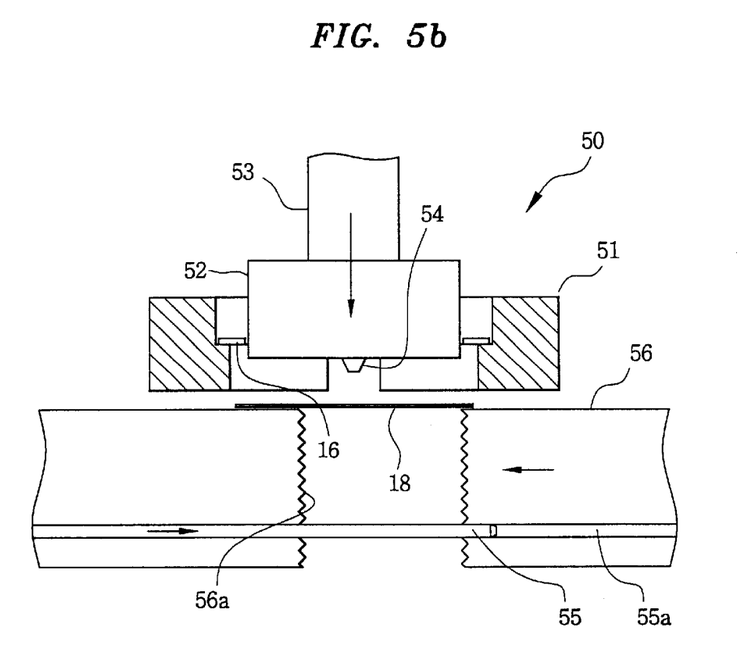

After the wafer ring assembly 10 is placed on the ring table 51, the detaching head 52 moves down to detach the wafer ring tape 18 from the wafer ring 16, as shown in FIG. 5B. The detaching head 52 applies a pressure onto the wafer ring tape 18 through the cylindrical outer frame 52a. The pressure is therefore localized on a portion adjacent to the wafer ring 16, allowing an easy and reliable detachment. While the detaching head 52 descends, the movable one of the pair of compressing plates 56 (the movable compressing plate) and the blocking pin 55 move inwardly and cross each other. The detached wafer ring tape 18 is temporarily placed on the pair of compressing plates 56.

Figure 5C:
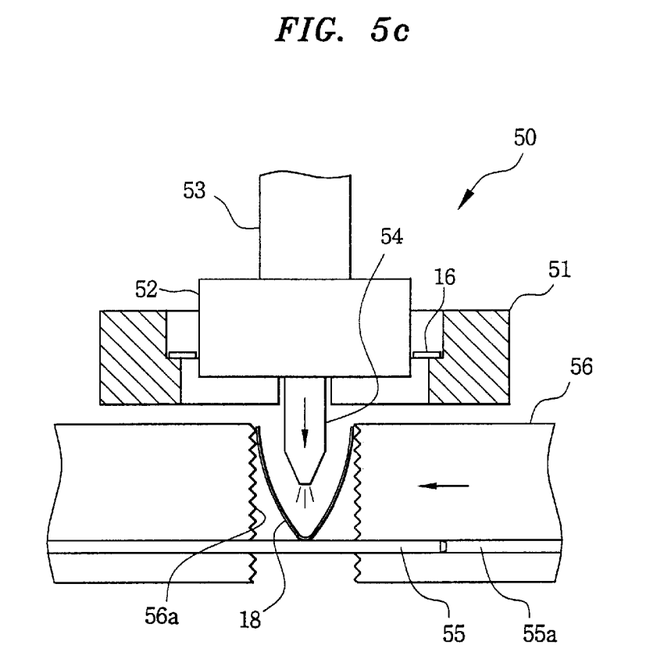

As shown in FIG. 5C, the detaching head 52 stops descending after the wafer ring tape 18 is detached, but the pressing shaft 54 continues descending. Also, the movable compressing plate 56 continues to move inwardly, narrowing the distance to the confronting fixed plate. The pressing shaft 54 pushes the wafer ring tape 18 down, so that wafer ring tape 18 on the pair of compressing plates 56 is folded in two. Thus, the folded wafer ring tape 18 is suspended on the blocking pin 55 at a central portion thereof, leaning against the saw-toothed surfaces 56a of the pair of compressing plates 56 at upward edge portions thereof. The pressing shaft 54 blows air over the wafer ring tape 18 to prevent adhering to it.

Figure 5D:
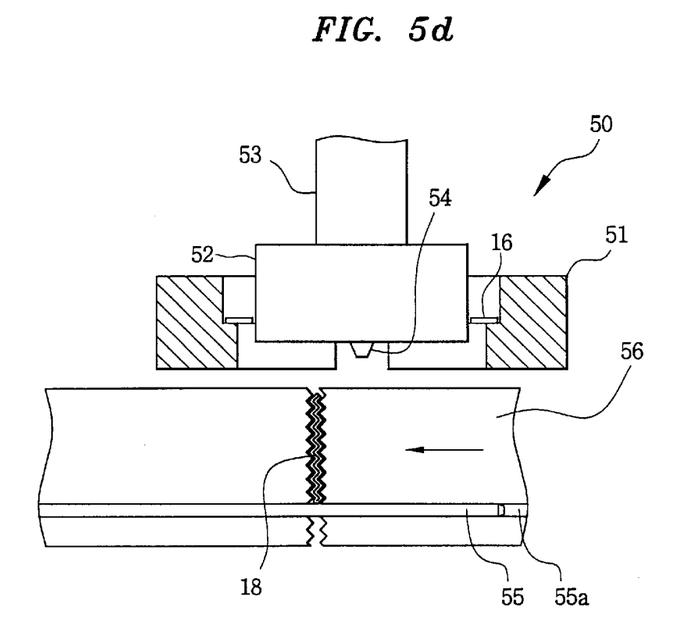
Figure 5E:
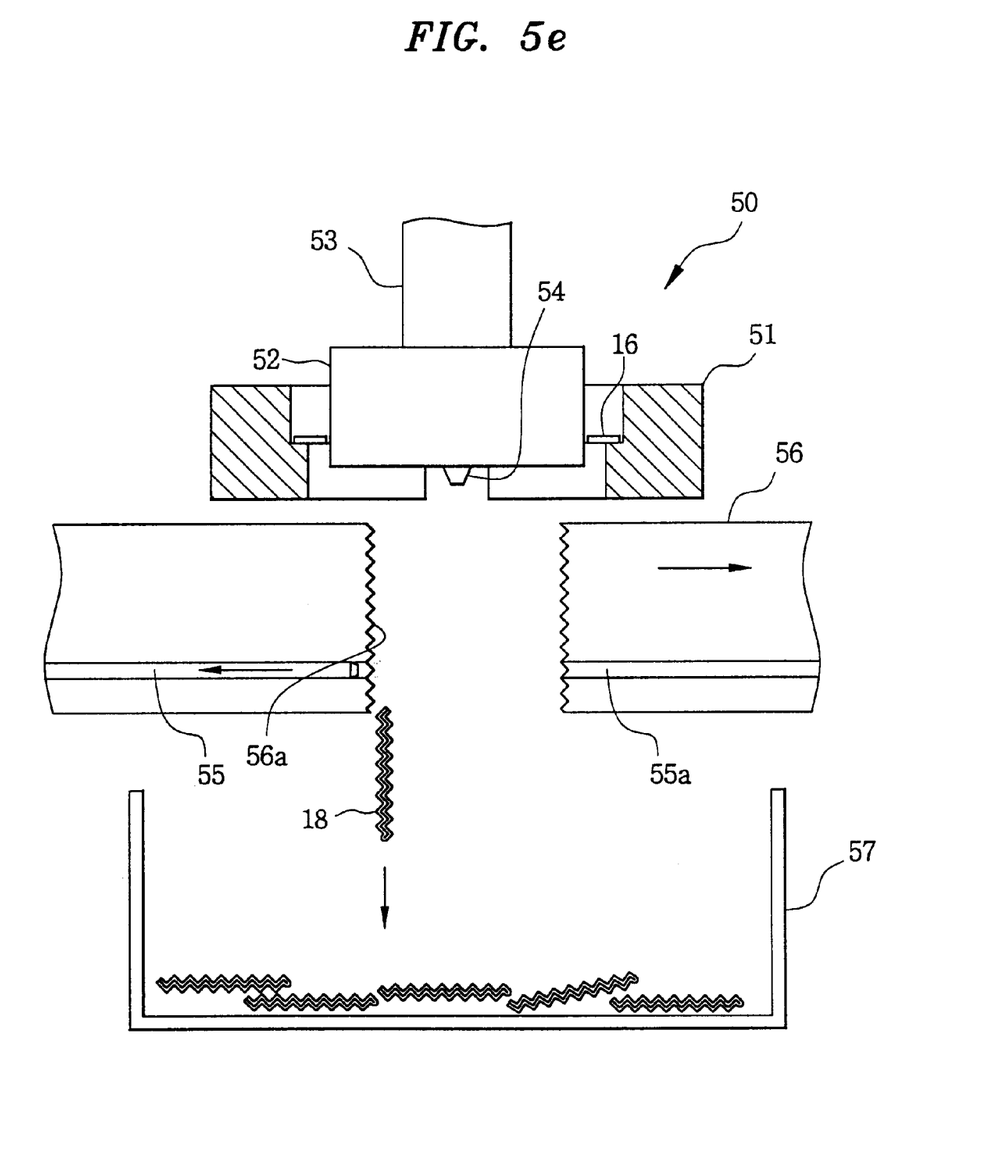

Thereafter, as shown in FIG. 5D, the pressing shaft 54 begins to ascend, whereas the movable compressing plate 56 continues to move inwardly. Finally, the pair of compressing plates 56 press toward each other at the saw-toothed surface 56a. Consequently, the wafer ring tape 18 is compressed on both sides, and the defective chips remaining on the wafer ring tape 18 are crushed between the plates.

Subsequently, as shown in FIG. 5E, the movable compressing plate 56 and the blocking pin 55 return to their initial positions. Therefore, the compressed and crushed tape 18 falls down into the scrap box 57. In the present embodiment, the pair of compressing plates 56 has one movable plate and one fixed plate. Alternatively, two movable plates can be used. The blocking pin 55 can be placed in either or both of the plates.

After the removal of the wafer ring tape 18, the ring table 51 with the wafer ring 16 moves to the wafer ring loading/unloading section 40. Then, as described above, the unloading picker 44 transfers the wafer ring 16 to the ring box 46 for reuse.

As explained hereinbefore, the apparatus according to the present invention enables automatic removal of the wafer ring tape 18. Accordingly, higher productivity is realized, and the possibility of accidents can be reduced. In addition, damage or deformation of the wafer ring is prevented. Furthermore, since the chip is crushed while removing the wafer ring tape 18, the chips would not flow out.

In the present invention, the wafer ring assembly can be directly and individually supplied for the removing apparatus using not the wafer cassette, but a similar container. Similarly, the loading picker may not be used, so the loading conveyor may carry the wafer ring assembly directly to the removing apparatus. In addition, a member such as the loading picker can be employed to take out the wafer ring assembly from the wafer cassette instead of using the slide. Furthermore, it may be possible to use a combined member alternative to the detaching head and the pressing shaft. The apparatus of the present invention is not limited to the size of the wafer used.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An apparatus for removing a wafer ring tape, on which defective chips remain, from a wafer ring after normal chips are detached from the wafer ring tape, said apparatus comprising:

a ring table for supporting a tape-adhered wafer ring in which the wafer ring tape is attached to the wafer ring;

a detaching head positionable above the ring table and movable for detaching the wafer ring tape from the wafer ring;

a blocking pin disposed under the ring table to support the wafer ring tape detached from the wafer ring; and a pair of compressing plates disposed under the ring table to compress the wafer ring tape supported by the blocking pin.

2. The apparatus of claim 1, further comprising:

a loading member disposed near the ring table to load the tape-adhered wafer ring onto the ring table.

3. The apparatus of claim 1, further comprising:

an unloading member disposed near the ring table to unload the wafer ring from the ring table.

4. The apparatus of claim 1, further comprising:

a scrap box positionable under the compressing plates to receive the pressed wafer ring tape.

5. The apparatus of claim 1, further comprising:

a ring box disposed near the ring table to receive the wafer ring from which the wafer ring tape is removed.

6. An apparatus for removing a wafer ring tape, on which defective chips remain, from a wafer ring after normal chips are detached from the wafer ring tape, said apparatus comprising:

a ring table for supporting a wafer ring assembly in which the wafer ring tape is attached to the wafer ring;

a detaching head positionable above the ring table and being capable of moving vertically;

a pressing shaft disposed inside the detaching head and being capable of moving vertically separately from the detaching head;

a pair of compressing plates disposed under the ring table and being capable of moving horizontally; and a blocking pin disposed in the compressing plates and being capable of moving horizontally, wherein the detaching head moves downwardly and detaches the wafer ring tape from the wafer ring, wherein the pressing shaft moves down and then pushes downwardly the detached wafer ring tape so that the wafer ring tape is folded and suspended on the blocking pin, and wherein the compressing plates compress the folded wafer ring tape.

7. The apparatus of claim 6, further comprising:

a loading member positionable near the ring table and being capable of loading the wafer ring assembly onto the ring table.

8. The apparatus of claim 6, further comprising:

an unloading member positionable near the ring table and being capable of unloading the wafer ring from the ring table.

9. The apparatus of claim 6, further comprising:

a scrap box positionable under the compressing plates and being capable of receiving the wafer ring tape pressed and crushed by the compressing plates.

10. The apparatus of claim 6, further comprising:

a ring box positionable near the ring table and being capable of receiving the wafer ring from which the wafer ring tape is removed.

11. The apparatus of claim 6, wherein the detaching head has a cylindrical outer frame having an outside diameter substantially equal to but less than an inside diameter of the wafer ring.

12. An apparatus for removing a wafer ring tape, on which defective chips remain, from a wafer ring after normal chips are detached from the wafer ring tape, said apparatus comprising:

a wafer cassette containing a plurality of wafer ring assemblies, each having the wafer ring and the wafer ring tape attached thereto;

a loading conveyor for supplying the wafer cassette;

a rotatable plate disposed near the loading conveyor to receive the wafer cassette thereon from the loading conveyor and being capable of moving vertically and rotatively;

a slide disposed close to the rotatable plate to facilitate a discharge of the wafer ring assembly from the wafer cassette while the wafer cassette inclines toward the slide by a rotation of the rotatable plate;

a ring stand disposed near the slide to receive the wafer ring assembly thereon through the slide from the wafer cassette;

a loading picker positionable above the ring stand to move vertically and horizontally to transfer the wafer ring assembly on the ring stand;

a ring table positionable near the loading picker to receive and support the wafer ring assembly transferred by the loading picker;

a detaching head positionable above the ring table to move downwardly to detach the wafer ring tape from the wafer ring in the wafer ring assembly;

a pressing shaft disposed inside the detaching head to move down separately from the detaching head to fold the detached wafer ring tape;

a blocking pin disposed under the ring table to temporarily support the folded wafer ring tape; and a pair of compressing plates disposed under the ring table to compress the wafer ring tape suspended on the blocking pin and crush the defective chips remaining on the wafer ring tape.

13. The apparatus of claim 12, further comprising:

an unloading conveyor disposed near the rotatable plate to unload the wafer cassette, in which a discharge of the wafer ring assembly is finished, from the rotatable plate.

14. The apparatus of claim 12, further comprising:

an unloading picker disposed near the ring table to unload the wafer ring from the ring table.

15. The apparatus of claim 12, wherein the ring table moves between the loading picker and the detaching head.

16. The apparatus of claim 12, further comprising:

a scrap box disposed under the compressing plates to receive the wafer ring tape having been pressed and crushed by the compressing plates.

17. The apparatus of claim 12, further comprising:

a ring box disposed near the ring table to receive the wafer ring from which the crushed wafer ring tape is removed.

18. The apparatus of claim 12, wherein the detaching head has a cylindrical outer frame forming an inner space, and wherein the cylindrical outer frame has an outside diameter substantially equal to but less than an inside diameter of the wafer ring.

19. The apparatus of claim 12, wherein the ring table having an inside cylindrical space having a projection that extends inwardly toward the center of the space, and wherein the tape-adhered wafer ring rests thereon to detach the wafer ring tape from the wafer ring.

* * * * *